(12) United States Patent
Xu et al.

(10) Patent No.: US 11,315,843 B2
(45) Date of Patent: Apr. 26, 2022

(54) EMBEDDED COMPONENT AND METHODS OF MAKING THE SAME

(71) Applicant: Intel Corporation, Santa Clara, CA (US)

(72) Inventors: Yi Elyn Xu, Folsom, CA (US); Bilal Khalaf, Folsom, CA (US); Dennis Sean Carr, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 16/472,837

(22) PCT Filed: Dec. 28, 2016

(86) PCT No.: PCT/US2016/068970
§ 371 (c)(1),
(2) Date: Jun. 21, 2019

(87) PCT Pub. No.: WO2018/125097
PCT Pub. Date: Jul. 5, 2018

(65) Prior Publication Data
US 2019/0371687 A1    Dec. 5, 2019

(51) Int. Cl.
| | |
|---|---|
| *H01L 23/48* | (2006.01) |
| *H01L 23/13* | (2006.01) |
| *H01L 21/48* | (2006.01) |
| *H01L 23/498* | (2006.01) |
| *H01L 25/16* | (2006.01) |

(52) U.S. Cl.
CPC ........ *H01L 23/13* (2013.01); *H01L 21/4846* (2013.01); *H01L 23/49838* (2013.01); *H01L 25/16* (2013.01)

(58) Field of Classification Search
CPC .............. H01L 23/13; H01L 23/49838; H01L 21/4846
USPC ........................................................ 257/724
See application file for complete search history.

(56) References Cited

U.S. PATENT DOCUMENTS

| | | | | |
|---|---|---|---|---|
| 5,111,278 A | * | 5/1992 | Eichelberger | ......... H01L 23/473 257/698 |
| 5,796,165 A | * | 8/1998 | Yoshikawa | ......... H01L 23/3121 257/728 |

(Continued)

FOREIGN PATENT DOCUMENTS

KR    1020160039525 A    4/2016

OTHER PUBLICATIONS

"International Application Serial No. PCT/US2016/068970, International Search Report dated Sep. 28, 2017", 3 pgs.

(Continued)

*Primary Examiner* — Nitin Parekh
(74) *Attorney, Agent, or Firm* — Schwegman Lundberg & Woessner, P.A.

(57) ABSTRACT

Various embodiments disclosed relate to a substrate for a semiconductor device. The substrate includes a first major surface and a second major surface opposite the first major surface. The substrate further includes a cavity defined by a portion of the first major surface. The cavity includes a bottom dielectric surface and a plurality of sidewalls extending from the bottom surface to the first major surface. A first portion of a first sidewall includes a conductive material.

16 Claims, 3 Drawing Sheets

(56) References Cited

U.S. PATENT DOCUMENTS

| | | | | |
|---|---|---|---|---|
| 5,808,878 A | * | 9/1998 | Saito | H01L 23/552 |
| | | | | 361/818 |
| 6,380,619 B2 | * | 4/2002 | Ahiko | H05K 3/3442 |
| | | | | 257/703 |
| 7,176,579 B2 | * | 2/2007 | Konishi | H01L 23/3121 |
| | | | | 257/724 |
| 8,330,278 B2 | * | 12/2012 | Lee | H01L 25/0657 |
| | | | | 257/777 |
| 9,230,944 B1 | * | 1/2016 | Lambert | H01L 21/4846 |
| 2004/0089922 A1 | | 5/2004 | Gerber et al. | |
| 2006/0145339 A1 | * | 7/2006 | Yang | H01L 23/3121 |
| | | | | 257/724 |
| 2008/0032456 A1 | | 2/2008 | Ahn et al. | |
| 2010/0014821 A1 | | 6/2010 | Huang et al. | |
| 2010/0206619 A1 | * | 8/2010 | Chen | H05K 1/183 |
| | | | | 174/252 |
| 2011/0221053 A1 | * | 9/2011 | Chandrasekaran | H01L 25/50 |
| | | | | 257/686 |
| 2012/0037935 A1 | | 2/2012 | Yang | |
| 2016/0343635 A1 | * | 11/2016 | Rae | H01L 21/561 |
| 2017/0018493 A1 | * | 1/2017 | Lee | H01L 21/486 |
| 2017/0047308 A1 | * | 2/2017 | Ho | H01L 25/0652 |
| 2018/0145051 A1 | * | 5/2018 | Loo | H01L 25/0655 |
| 2018/0125097 A1 | | 7/2018 | Xu et al. | |
| 2018/0277395 A1 | * | 9/2018 | Masukawa | B32B 38/10 |

OTHER PUBLICATIONS

"International Application Serial No. PCT/US2016/068970, Written Opinion dated Sep. 28, 2017", 7 pgs.

* cited by examiner

FIG. 4

EMBEDDED COMPONENT AND METHODS OF MAKING THE SAME

CROSS-REFERENCE TO RELATED APPLICATION

This application is a U.S. National Stage Filing under 35 U.S.C. 371 from International Application No. PCT/US2016/068970, filed on Dec. 28, 2016, which application is incorporated herein by reference in its entirety.

BACKGROUND

Semiconductor packages include a number of electrical components that are responsible for carrying out various functions. These components, however, can make semiconductor packages too large to fit into certain devices. It is therefore desirable to minimize the size of semiconductor packages.

BRIEF DESCRIPTION OF THE FIGURES

The drawings illustrate generally, by way of example, but not by way of limitation, various embodiments discussed in the present document.

DETAILED DESCRIPTION

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts can be carried out in any order without departing from the principles of the inventive subject matter, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%.

Figure 1:
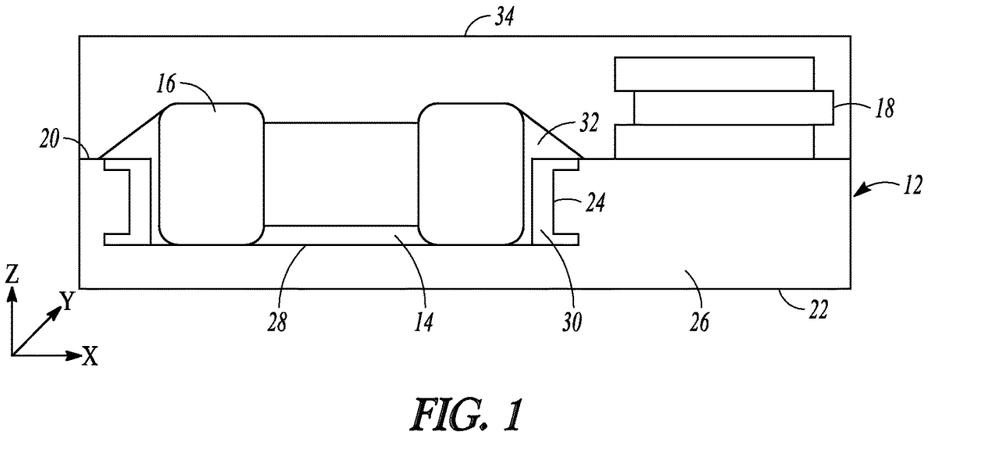
FIG. 1 is a sectional view of a semiconductor package, in accordance with various embodiments.

FIG. 1 is a sectional view of semiconductor package 10. As illustrated, semiconductor package 10 includes substrate 12, cavity 14, first electrical component 16, and second electrical component 18. Substrate 12 has a z-directional height or thickness defined between a first major surface 20 and second major surface 22. Substrate 12 is formed from a plurality of electronically conducting vias 30 that are embedded within dielectric material 26. Conducting vias 30 are made from an electronically conducting material such as copper. The dielectric material 26 may be selected from an organic-based build-up film, a glass-reinforced epoxy, such as FR-4, polytetrafluorethylene (Teflon), a cotton-paper reinforced epoxy (CEM-3), a phenolic-glass (G3), a paper-phenolic (FR-1 or FR-2), and polyester-glass (CEM-5).

Cavity 14 is formed in substrate 12. Cavity 14 is defined by a portion of first major surface 20. Cavity 14 extends downward in a z-direction from first major surface 20 to bottom surface 28. Sidewalls 24 extend from bottom surface 28 to first major surface 20, and an x-y direction plane is defined between sidewalls 24. Sidewalls 24 may be formed from the dielectric material 26 but a portion of at least one of sidewalls 24 is formed from an electrically conductive material. As illustrated in FIG. 1, vias 30 define a portion of sidewalls 24.

The portion of first major surface 20 defining cavity 14 may vary. For example, the first portion of first major surface 20 may range from about 10% to about 50% of the surface area of first major surface 20, or from about 15% to about 25% of the surface area of the first major surface 20, or less than, equal to, or greater than 10%, 15, 20, 25, 30, 35, 40, 45, or 50% of the surface area of first major surface 20. Cavity 14 extends into substrate 12 to about 15 height % to about 80 height % of substrate 12, or to about 40 height % to about 60 height % of substrate 12, or less than, equal to, or greater than 15 height %, 20, 25, 30, 35, 40, 45, 50, 55, 60, 65, 70, 75, or 80 height % of substrate 12.

The amount that cavity 14 extends into substrate 12 may be a function of many different factors. For example, the extent to which cavity 14 extends into substrate 12 may be driven by the height of electrical component 16 disposed therein. Additionally, cavity 14 may be designed to not extend too far into substrate 12 so as not to affect the structural integrity of substrate 12.

Cavity 14 may have a substantially circular profile or a substantially polygonal profile. Examples of suitable polygonal profiles include a substantially triangular shaped profile, a substantially square shaped profile, or a substantially rectangular shaped profile. The shape of the profile may depend on the shape of electrical component 16 disposed therein. For example, the shape of the profile may be designed to substantially match the profile of electrical component 16 to provide a better fit and better secure the component within cavity 14.

As shown in FIG. 1, sidewalls 24 extend in a substantially perpendicular direction from bottom surface 28 of cavity 14. The angle between sidewalls 24 and bottom surface 28 is substantially 90 degrees. Each sidewall 24 extends in a substantially parallel direction with respect to each other.

The number of sidewalls 24 defining cavity 14 may vary. If, for example, cavity 14 has a substantially square or rectangular profile, cavity 14 will have four sidewalls 24. At least one of the four sidewalls 24 will have a portion that is defined by a conductive material. In some circumstances, the conductive material is the copper from via 30. The portion of such a sidewall 24 may range from about 25% to about 100% of the surface area of the first sidewall 24, or about 80% to about 100% of the surface area of the first sidewall 24, or less than about, equal to, or greater than about 25%, 30, 35, 40, 45, 50, 55, 60, 65, 70, 75, 80, 85, 90, 95, or 100% of the surface area of the first sidewall 24. Other sidewalls 24 may be substantially free of any conductive material.

As shown in FIG. 1, more than one via 30 may be present in cavity 14. For example cavity 14 may include a second via 30 which defines a second portion of sidewalls 24. The second portion of sidewalls 24 may range from about 25% to about 100% of the surface area of the first sidewall 24 or a second sidewall 24, or about 80% to about 100% of the surface area of the first sidewall 24 or a second sidewall 24, or less than about, equal to, or greater than about 25%, 30, 35, 40, 45, 50, 55, 60, 65, 70, 75, 80, 85, 90, 95, or 100% of the surface area of the first sidewall 24 or the second sidewall 24. The second via 30 may be adjacent to the first via on the same sidewall 24. That is, the first and second vias 30 may be in contact with each other or near each other. Additionally, the first and second vias 30 may be located on different sidewalls 24.

In examples where via 30 defines a portion of sidewall 24, via 30 may be formed to have a semicircular profile. More specifically, a first portion of via 30 may be substantially non-circular. Designing the first portion this way may allow the first portion of via 30 to be flush with sidewall 24. This may make it easier to insert electrical component 16 in cavity 14.

Additional vias 30 may define other portions of sidewalls 24. For example, three vias 30 may be disposed along a first sidewall 24 in a row and three vias 30 may be disposed in a row along an opposed second sidewall 24. The amount of vias 30 in cavity 14, as well as their location therein, may be driven by the location of connections in electrical component 16 disposed in cavity 14. That is, vias 30 may be arranged in cavity 14 to form a connection with electrical component 16.

Although sidewalls 24 include a conductive material, bottom surface 28 is substantially free of any conductive material. As described further herein, this may provide certain benefits to the semiconductor package. In some examples, bottom surface 28 is substantially planar. Bottom surface 28 may include an adhesive material, in some examples, to help secure the electrical component 16 within cavity 14. Although only one cavity 14 is shown in FIG. 1, it is within the scope of this disclosure to include additional cavities.

As shown in FIG. 1, first electrical component 16 is disposed at least partially within cavity 14. First electrical component 16 may be one of many suitable electrical components such as a capacitor, a resistor, or an inductor. Electrical contacts of first electrical component 16 are joined to vias 30. Vias 30 transmit an electrical signal to first electrical component 16 or receive an electrical signal from first electrical component 16. First electrical component 16 is held in cavity 14 by solder 32.

As shown in FIG. 1, first electrical component 16 is partially embedded in cavity 14. That is, a portion of first electrical component 16 projects from cavity 14 beyond first major surface 20. Alternatively, first electrical component 16 may be configured to be completely embedded within cavity 14, (e.g., it does not extend beyond first major surface 20). In some examples, the extent to which first electrical component 16 projects from cavity 14 depends on the z-directional height of second electrical component 18.

Second electrical component 18 is attached to first major surface 20 of substrate 12. As shown, second electrical component 18 is not located in cavity 14. Second electrical component 18 may be any suitable component. For example, second electrical component 18 may be a silicon die component. Examples of suitable silicon die components include a central processing unit, a flash memory, a wireless charger, a power management integrated circuit (PMIC), a Wi-Fi transmitter, a global positioning system, and a NAND flash memory stack. As shown in FIG. 1, second electrical component 18 is a NAND memory stack. Tre types of components in a stack such as second electrical component 18 can vary. For example, some stacks can include a controller, a DRAM, and a NAND stacked together. Second electrical component 18 may include a number of interconnects between it and first major surface 20 to transmit and/or receive an electrical signal therebetween. Although only two electrical components 16, 18 are shown in FIG. 1, it is within the scope of this disclosure to include additional electrical components.

As shown in FIG. 1, the top of second electrical component 18 is higher than the top of first electrical component 16. In other examples, the tops of second electrical component 18 and first electrical component 16 may be substantially even. In many examples, the top of first electrical component 16 will not be higher than the top of second electrical component 18.

Mold 34 at least partially covers first major surface 20, first electrical component 16, and second electrical component 18. Mold 34 defines the overall z-directional height of package 10. The clearance between the top of mold 34 and the higher of first electrical component 16 and second electrical component 18 is minimal. Therefore the overall z-directional height of package 10 is defined by the height of first electrical component 16 and second electrical component 18.

Figure 2:
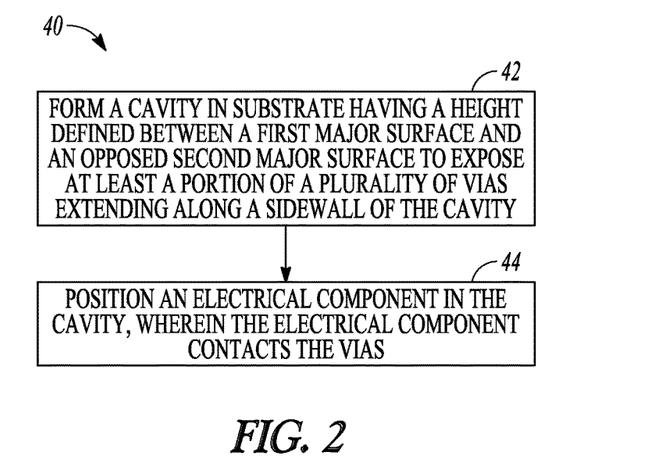
FIG. 2 is a flow diagram generally illustrating a method of forming the semiconductor package, in accordance with various embodiments.

FIG. 2 is a flow diagram generally illustrating method 40 of forming semiconductor package 10. As shown in FIG. 2, method 40 includes forming step 42. In forming step 42, cavity 14 is formed in substrate 12. Method 40 further includes positioning step 44. In positioning step 44, first electrical component 16 is placed in cavity 14.

Figure 3A:
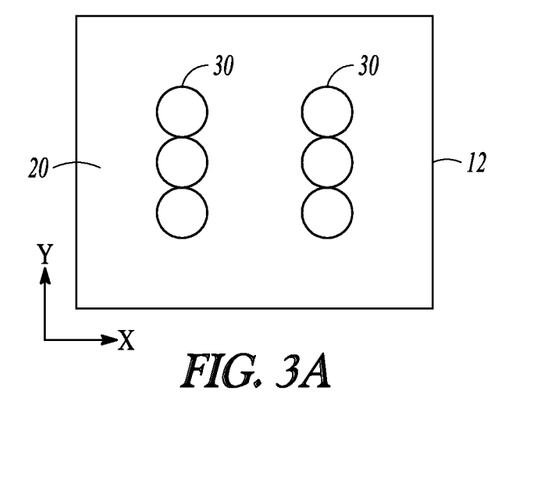
FIGS. 3A-3C are schematic diagrams showing various stages of forming the semiconductor package, in accordance with various embodiments.
Figure 3B:
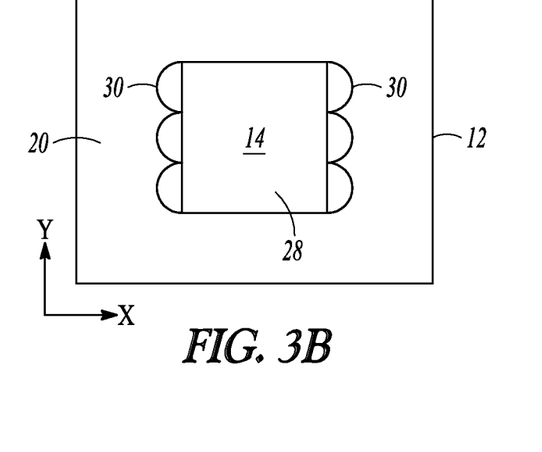
Figure 3C:
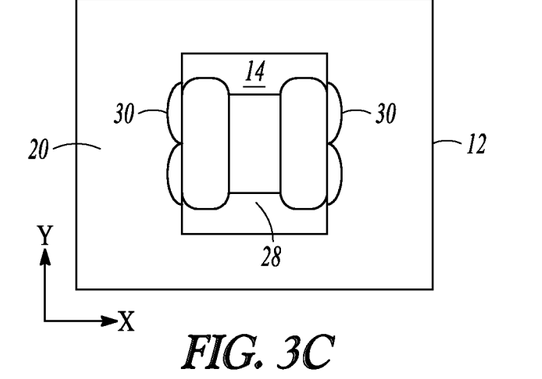

FIGS. 3A-3C are schematic diagrams showing various stages of forming package 10 according to method 40. FIGS. 3A and 3B generally depict forming step 42. FIG. 3A is a top view of substrate 12. As shown, two rows of vias 30 are arranged within substrate 12. In FIG. 3B, cavity 14 is formed by cutting through a portion of substrate 12 and vias 30. Cutting may be accomplished with a drill, laser, or any other suitable device. As shown in FIG. 3B, each via 30 is cut approximately in half in the z-direction. This provides a flat surface to serve as a connection to first electrical component 16. Alternatively cavity, 14 can be formed by building substrate 12 through a series of layers that each include a cutout and then laminate those layers together with layers that do not include a cutout such that cavity 14 is formed.

FIG. 3C shows first electrical component 16 placed in cavity 14. As shown, first electrical component 16 is in contact with vias 30. As also shown, there is a tight tolerance in the x-y direction between first electrical component 16 and sidewalls 24, with minimal gaps therebetween. First electrical component 16 may be further attached to substrate 12 by soldering it to substrate 12.

Second electrical component 18 may be attached to first major surface 20. Second electrical component 18 may be electrically coupled to substrate 12 through interconnects such as solder balls or wire connections.

There are many reasons to use package 10, including the following non-limiting reasons. For example, in some embodiments, cavity 14 may allow package 10 to have an overall smaller z-directional height than a corresponding package that does not include cavity 14. In many cases it may be desirable to reduce the z-directional height of the package 10 to a minimum. That is, a smaller z-directional height in package 10 may help to reduce the overall z-directional height of a device incorporating package 10. The overall z-directional height reduction in package 10 is made possible, in part, by partially embedding first electrical component 16 in cavity 14. In some cases, such as when first electrical component 16 is a capacitor, resistor, or inductor, first electrical component 16 will have a larger z-directional height than second electrical component 18. If both components were placed on first major surface 20, then first electrical component 16 would, unnecessarily, increase the overall z-directional height of package 10. By placing first electrical component 16 in cavity 14, however, the overall z-directional height of first electronic component 16 may be less than or equal to that of second electrical component 18. Thus, the overall z-directional height of package 10 may be minimized.

According to some embodiments, placing first electrical component 16 in cavity 14 may also improve the electrical properties of package 10. For example, larger capacitors that had previously prohibitive z-directional heights may now be incorporated into package 10. That is, cavity 14 allows the z-directional height of a larger component to be accommodated by designing cavity 14 to extend to a certain depth to minimize the impact of a component's z-directional height. The ability to incorporate larger components into package 10 may lead to increased performance in package 10.

According to some examples, using vias 30 as connectors to first electronic component 16 may reduce the overall x-y directional size of cavity 14 compared to a corresponding package with connection points on a bottom surface of a cavity. If the connection points were on bottom surface 28 as opposed to sidewalls 24, then sidewalls 24 would have to be sloped. That is, sidewalls 24 would no longer be parallel to each other. This would be necessary to make it possible for a machine to plate a bottom surface of a cavity with a conductive material. Sloping the sidewalls 24 would increase the x-y directional size of the cavity 14. However, because the conductive material in package 10 is on sidewalls 24, there is no need to slope sidewalls 24 in order to plate bottom surface 28. With the decreased x-y directional size of cavity 14, more space is available on package 10 to attach additional components or form another cavity.

In some embodiments, an additional benefit to having the conductive material on sidewalls 24 is that it is easier to detect and repair connection defects in package 10 than a corresponding package with the conductive material on the bottom of the cavity 14. That is, the connection between vias 30 and first electrical component 16 are visible. In contrast, if the connections were on bottom surface 28, then detection and repair of a connection problem would require the complete removal of first electrical component 16 in order to access and repair the connections.

In some embodiments, method 40 provides a more cost effective manufacturing process for assembling package 10. This is because, in some examples, method 40 does not include plating a conductive material in cavity 14. Vias 30 are already dispersed in substrate 12. Thus, forming the conductive surface in cavity 14 merely includes cutting substrate 12 to expose a portion of vias 30. Therefore, there is no additional cost or time in method 40 associates with plating a conductive material within cavity 14.

Figure 4:
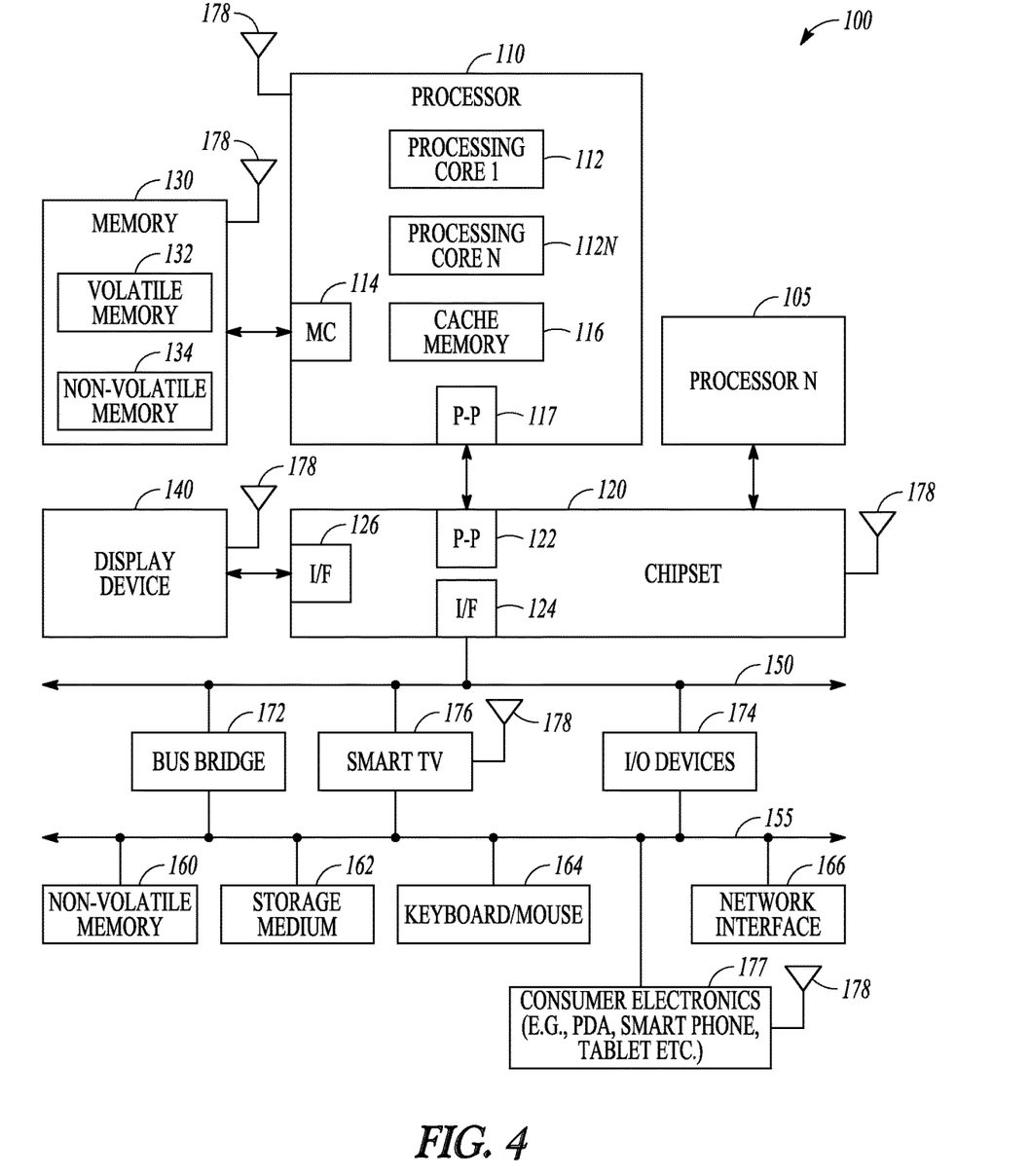
FIG. 4 is block diagram of an electronic system, in accordance with various embodiments.

FIG. 4 illustrates a system level diagram, according to an embodiment of the invention. For instance, FIG. 4 depicts an example of an electronic device (e.g., system) including package 10, which includes first electronic component 16 and second electronic component 18. FIG. 4 is included to show an example of a higher-level device application for the present inventive subject matter. In an embodiment, system 100 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 100 is a system on a chip (SOC) system.

In an embodiment, processor 110 has one or more processing cores 112 and 112N, where 112N represents the Nth processor core inside processor 110, and where N is a positive integer. In an embodiment, system 100 includes multiple processors including 110 and 105, where processor 105 has logic similar or identical to the logic of processor 110. In some embodiments, processing core 112 includes, but is not limited to, pre-fetch logic to fetch instructions, decode logic to decode the instructions, execution logic to execute instructions, and the like. In some embodiments, processor 110 has a cache memory 116 to cache instructions and/or data for system 100. Cache memory 116 may be organized into a hierarchal structure including one or more levels of cache memory.

In some embodiments, processor 110 includes a memory controller 114, which is operable to perform functions that enable the processor 110 to access and communicate with memory 130 that includes a volatile memory 132 and/or a non-volatile memory 134. In some embodiments, processor 110 is coupled with memory 130 and chipset 120. Processor 110 may also be coupled to a wireless antenna 178 to communicate with any device configured to transmit and/or receive wireless signals. In an embodiment, the wireless antenna 178 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 132 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 134 includes, but is not limited to, flash memory, phase change memory (PCM), read-only memory (ROM), electrically erasable programmable read-only memory (EEPROM), or any other type of non-volatile memory device.

Memory 130 stores information and instructions to be executed by processor 110. In an embodiment, memory 130 may also store temporary variables or other intermediate information while processor 110 is executing instructions. In the illustrated embodiment, chipset 120 connects with processor 110 via Point-to-Point (PtP or P-P) interfaces 117 and 122. Chipset 120 enables processor 110 to connect to other elements in system 100. In some embodiments of the invention, interfaces 117 and 122 operate in accordance with a PtP communication protocol such as the Intel® QuickPath Interconnect (QPI) or the like. In other embodiments, a different interconnect may be used.

In some embodiments, chipset 120 is operable to communicate with processors 110, 105N, display device 140, and other devices 172, 176, 174, 160, 162, 164, 166, 177, etc. Chipset 120 may also be coupled to a wireless antenna 178 to communicate with any device configured to transmit and/or receive wireless signals.

Chipset 120 connects to display device 140 via interface 126. Display device 140 may be, for example, a liquid crystal display (LCD), a plasma display, cathode ray tube (CRT) display, or any other form of visual display device. In some embodiments of the invention, processor 110 and chipset 120 are merged into a single SOC. In addition, chipset 120 connects to one or more buses 150 and 155 that interconnect various elements 174, 160, 162, 164, and 166. Buses 150 and 155 may be interconnected together via a bus bridge 172. In an embodiment, chipset 120 couples with a non-volatile memory 160, a mass storage device(s) 162, a keyboard/mouse 164, and a network interface 166 via interface 124, smart TV 176, consumer electronics 177, etc.

In an embodiment, mass storage device 162 includes, but is not limited to, a solid state drive, a hard disk drive, a universal serial bus flash memory drive, or any other form of computer data storage medium. In an embodiment, network interface 166 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In an embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the system 100, the functions performed by some of these blocks may be integrated within a single semiconductor circuit or may be implemented using two or more separate integrated circuits. For example, although cache memory 116 is depicted as a separate block within processor 110, cache memory 116 (or selected aspects of cache memory 116) may be incorporated into processor core 112.

ADDITIONAL EMBODIMENTS

The following exemplary embodiments are provided, the numbering of which is not to be construed as designating levels of importance:

Embodiment 1 provides a substrate comprising:
a first major surface;
a second major surface opposite the first major surface; and
a cavity defined by a portion of the first major surface, wherein the cavity comprises:
a bottom dielectric surface; and
a plurality of sidewalls extending from the bottom surface to the first major surface, wherein a first portion of a first sidewall comprises a conductive material.

Embodiment 2 provides the substrate of any one of Embodiments 1, wherein the substrate comprises a dielectric material.

Embodiment 3 provides the substrate of any one of Embodiments 1-2, wherein the dielectric material is at least one of organic-based build-up film, glass-reinforced epoxy, cotton-paper reinforced epoxy (CEM-3), phenolic-glass (G3), paper-phenolic (FR-1 or FR-2), and polyester-glass (CEM-5).

Embodiment 4 provides the substrate of any one of Embodiments 1-3, wherein the portion of the first major surface forming the cavity is about 10% to about 50% of the surface area of the first major surface.

Embodiment 5 provides the substrate of any one of Embodiments 1-4, wherein the portion of the first major surface forming the cavity is about 15% to about 25% of the surface area of the first major surface.

Embodiment 6 provides the substrate of any one of Embodiments 1-5, wherein a height of the substrate is defined between the first major surface and the second major surface.

Embodiment 7 provides the substrate of any one of Embodiments 1-6, wherein the cavity extends to about 15 height % to about 80 height % of the substrate.

Embodiment 8 provides the substrate of any one of Embodiments 1-7, wherein the cavity extends to about 40 height % to about 60 height % of the substrate.

Embodiment 9 provides the substrate of any one of Embodiments 1-8, wherein the cavity has a substantially polygonal profile.

Embodiment 10 provides the substrate of any one of Embodiments 1-9, wherein the polygonal profile is substantially triangular shaped, substantially square shaped, or substantially rectangular shaped.

Embodiment 11 provides the substrate of any one of Embodiments 1-10, wherein the sidewalls extend in a substantially perpendicular direction from the bottom surface of the cavity.

Embodiment 12 provides the substrate of any one of Embodiments 1-11, wherein the sidewalls are substantially parallel to each other.

Embodiment 13 provides the substrate of any one of Embodiments 1-12, wherein the first portion of the first sidewall is about 25% to about 100% of the first sidewall.

Embodiment 14 provides the substrate of any one of Embodiments 1-13, wherein the first portion of the first sidewall is about 80% to about 100% of the first sidewall.

Embodiment 15 provides the substrate of any one of Embodiments 1-14, wherein the conductive material is copper.

Embodiment 16 provides the substrate of any one of Embodiments 1-15, wherein the conductive material comprises a first via at least partially embedded within the substrate.

Embodiment 17 provides the substrate of any one of Embodiments 1-16, wherein the first via has a semicircular profile.

Embodiment 18 provides the substrate of any one of Embodiments 1-17, wherein a first portion of the first via is flush with the sidewalls.

Embodiment 19 provides the substrate of any one of Embodiments 1-18, wherein the conductive material further comprises a second via.

Embodiment 20 provides the substrate of any one of Embodiments 1-19, wherein the second via is adjacent to the first via on the sidewalls.

Embodiment 21 provides the substrate of any one of Embodiments 1-20, wherein the first via and the second via are in direct contact with each other.

Embodiment 22 provides the substrate of any one of Embodiments 1-21, wherein a second portion of a second sidewall comprises a conductive material.

Embodiment 23 provides the substrate of any one of Embodiments 1-22, wherein the second portion of the second sidewall is about 25% to about 100% of the first sidewall.

Embodiment 24 provides the substrate of any one of Embodiments 1-23, wherein the second portion of the second sidewall is about 80% to about 100% of the first sidewall.

Embodiment 25 provides the substrate of any one of Embodiments 1-24, wherein the conductive material comprises a third via at least partially embedded within the substrate.

Embodiment 26 provides the substrate of any one of Embodiments 1-25, wherein the third via has a semicircular profile.

Embodiment 27 provides the substrate of any one of Embodiments 1-26, wherein a second portion of the third via is flush with the sidewalls.

Embodiment 28 provides the substrate of any one of Embodiments 1-27, wherein the conductive material comprises a fourth via.

Embodiment 29 provides the substrate of any one of Embodiments 1-28, wherein the fourth via is adjacent to the third via on the sidewalls.

Embodiment 30 provides the substrate of any one of Embodiments 1-29, wherein the third via and the fourth via are in direct contact with each other.

Embodiment 31 provides the substrate of any one of Embodiments 1-30, wherein the bottom surface of the cavity is free of any conductive material.

Embodiment 32 provides a semiconductor package comprising:
  a substrate comprising:
    a first major surface; and
    a cavity defined by a portion of the first major surface, wherein the cavity comprises:
      a bottom dielectric surface; and
      a plurality of sidewalls extending from the bottom surface to the first major surface, wherein a portion of at least one of the sidewalls comprises a conductive material; and
  a first electrical component disposed at least partially within the cavity; and
  a second electrical component disposed on the first major surface of the substrate.

Embodiment 33 provides the semiconductor package of Embodiment 32, wherein the first electrical component is at least one of a capacitor, a resistor, and an inductor.

Embodiment 34 provides the semiconductor package of any one of Embodiments 32-33, wherein the second electrical component is a silicon die.

Embodiment 35 provides the semiconductor package of any one of Embodiments 32-34, wherein the silicon die is at least one of a central processing unit, a flash memory, a wireless charger, a power management integrated circuit (PMIC), a Wi-Fi transmitter, a global positioning system, and a NAND stack.

Embodiment 36 provides the semiconductor package of any one of Embodiments 32-35, wherein a top surface of the first electrical component is substantially even with a top surface of the second electrical component.

Embodiment 37 provides the semiconductor package of any one of Embodiments 32-36, wherein the substrate comprises a dielectric material.

Embodiment 38 provides the semiconductor package of any one of Embodiments 32-37, wherein the dielectric material is at least one of organic-based build-up film, glass-reinforced epoxy, cotton-paper reinforced epoxy (CEM-3), phenolic-glass (G3), paper-phenolic (FR-1 or FR-2), and polyester-glass (CEM-5).

Embodiment 39 provides the semiconductor package of any one of Embodiments 32-38, wherein the portion of the first major surface forming the cavity is about 10% to about 50% of the surface area of the first major surface.

Embodiment 40 provides the semiconductor package of any one of Embodiments 32-39, wherein the portion of the first major surface forming the cavity is about 15% to about 25% of the surface area of the first major surface.

Embodiment 41 provides the semiconductor package of any one of Embodiments 32-40, wherein a height of the substrate is defined between the first major surface and an opposed second major surface.

Embodiment 42 provides the semiconductor package of any one of Embodiments 32-41, wherein the cavity extends to about 15 height % to about 80 height % of the substrate.

Embodiment 43 provides the semiconductor package of any one of Embodiments 32-42, wherein the cavity extends to about 40 height % to about 60 height % of the substrate.

Embodiment 44 provides the semiconductor package of any one of Embodiments 32-43, wherein the cavity has a substantially polygonal profile.

Embodiment 45 provides the semiconductor package of any one of Embodiments 32-44, wherein the polygonal profile is substantially triangular shaped, substantially square shaped, or substantially rectangular shaped.

Embodiment 46 provides the semiconductor package of any one of Embodiments 32-45, wherein the sidewalls extend in a substantially perpendicular direction from the bottom surface of the cavity.

Embodiment 47 provides the semiconductor package of any one of Embodiments 32-46, wherein the sidewalls are substantially parallel to each other.

Embodiment 48 provides the semiconductor package of any one of Embodiments 32-47, wherein the first portion of the first sidewall is about 25% to about 100% of the first sidewall.

Embodiment 49 provides the semiconductor package of any one of Embodiments 32-48, wherein the first portion of the first sidewall is about 80% to about 100% of the first sidewall.

Embodiment 50 provides the semiconductor package of any one of Embodiments 32-49, wherein the conductive material is copper.

Embodiment 51 provides the semiconductor package of any one of Embodiments 32-50, wherein the conductive material comprises a first via at least partially embedded within the substrate.

Embodiment 52 provides the semiconductor package of any one of Embodiments 32-51, wherein the first via has a semicircular profile.

Embodiment 53 provides the semiconductor package of any one of Embodiments 32-52, wherein a first portion of the first via is flush with the first sidewall.

Embodiment 54 provides the semiconductor package of any one of Embodiments 32-53, wherein the conductive material further comprises a second via.

Embodiment 55 provides the semiconductor package of any one of Embodiments 32-54, wherein the second via is adjacent to the first via on the first sidewall.

Embodiment 56 provides the semiconductor package of any one of Embodiments 32-55, wherein the first via and the second via are in direct contact with each other.

Embodiment 57 provides the semiconductor package of any one of Embodiments 32-56, wherein a second portion of a second sidewall comprises a conductive material.

Embodiment 58 provides the semiconductor package of any one of Embodiments 32-57, wherein the second portion of the second sidewall is about 25% to about 100% of the first sidewall.

Embodiment 59 provides the semiconductor package of any one of Embodiments 32-58, wherein the second portion of the second sidewall is about 80% to about 100% of the first sidewall.

Embodiment 60 provides the semiconductor package of any one of Embodiments 32-59, wherein the conductive material comprises a third via at least partially embedded within the substrate.

Embodiment 61 provides the semiconductor package of any one of Embodiments 32-60, wherein the third via has a semicircular profile.

Embodiment 62 provides the semiconductor package of any one of Embodiments 32-61, wherein a second portion of the third via is flush with the first sidewall.

Embodiment 63 provides the semiconductor package of any one of Embodiments 32-62, wherein the conductive material comprises a fourth via.

Embodiment 64 provides the semiconductor package of any one of Embodiments 32-63, wherein the fourth via is adjacent to the third via on the first sidewall.

Embodiment 65 provides the semiconductor package of any one of Embodiments 32-64, wherein the third via and the fourth via are in direct contact with each other.

Embodiment 66 provides the semiconductor package of any one of Embodiments 32-65, wherein the bottom surface of the cavity is free of any conductive material.

Embodiment 67 provides a method of forming a semiconductor package comprising:

forming a cavity in a substrate having a height defined between a first major surface and an opposed second major surface to expose at least a portion of a plurality of vias extending along a sidewall of the cavity; and positioning an electrical component in the cavity, wherein the electrical component contacts the vias.

Embodiment 68 provides the method of Embodiment 67, wherein the cavity is formed by cutting the substrate.

Embodiment 69 provides the method of any one of Embodiments 67-68, wherein the substrate is cut with at least one of a laser and a drill.

Embodiment 70 provides the method of any one of Embodiments 67-69, wherein the substrate is cut to have a substantially polygonal profile.

Embodiment 71 provides the method of any one of Embodiments 67-70, wherein the polygonal profile is substantially triangular shaped, substantially square shaped, or substantially rectangular shaped.

Embodiment 72 provides the method of any one of Embodiments 67-71, wherein the cavity is cut to form sidewalls extending in a direction substantially parallel to each other.

Embodiment 73 provides the method of any one of Embodiments 67-72, wherein the cavity is cut to a depth ranging from about 10 height % to about 90 height % of the substrate.

Embodiment 74 provides the method of any one of Embodiments 67-73, wherein the cavity is cut to a depth ranging from about 50 height % to about 80 height % of the substrate.

Embodiment 75 provides the method of any one of Embodiments 67-74, wherein forming the cavity comprises cutting through the portion of the plurality of vias.

Embodiment 76 provides the method of any one of Embodiments 67-75, wherein the vias are cut in half in a z-direction.

Embodiment 77 provides the method of any one of Embodiments 67-76, wherein the electrical component is at least one of a capacitor, a resistor, and an inductor.

Embodiment 78 provides the method of any one of Embodiments 67-77, further comprising soldering the connection between the electrical component and the exposed portion of at least one of the vias.

Embodiment 79 provides the method of any one of Embodiments 67-78, further comprising attaching a silicon die to the first major surface of the substrate.

Embodiment 80 provides the method of any one of Embodiments 67-79, wherein the silicon die is at least one of a central processing unit, a flash memory, a wireless charger, a power management integrated circuit (PMIC), a Wi-Fi transmitter, a global positioning system, and a NAND stack.

What is claimed is:

1. A substrate comprising:
   a first major surface;
   a second major surface opposite the first major surface; and
   a cavity defined by a portion of the first major surface, wherein the cavity comprises:
   an exposed bottom dielectric surface that is substantially free of any conductive material;
   a plurality of sidewalls extending from the bottom surface to the first major surface, wherein the plurality of sidewalls comprises a conductive material along an entire height of the plurality of sidewalls; and
   an electrical component disposed in the cavity and in electrical contact with the plurality of sidewalls along the entire height of the plurality of sidewalls.

2. The substrate of claim 1, wherein the substrate comprises a dielectric material.

3. The substrate of claim 1, wherein the portion of the first major surface forming the cavity is about 10% to about 50% of the surface area of the first major surface.

4. The substrate of claim 1, wherein a height of the substrate is defined between the first major surface and the second major surface.

5. The substrate of claim 4, wherein the cavity extends to about 15 height % to about 80 height % of the substrate.

6. The substrate of claim 1, wherein the sidewalls are substantially parallel to each other.

7. The substrate of claim 1, wherein a first portion of a first sidewall is about 25% to about 100% of a surface area of the first sidewall.

8. The substrate of claim 1, wherein the conductive material comprises a first via at least partially embedded within the substrate.

9. The substrate of claim 8, wherein the first via has a semicircular profile.

10. A semiconductor package comprising:
a substrate comprising:
a first major surface; and
a cavity defined by a portion of the first major surface, wherein the cavity comprises:
an exposed bottom dielectric surface that is substantially free of any conductive material; and
a plurality of sidewalls extending from the bottom surface to the first major surface, wherein the plurality of sidewalls comprises a conductive material along an entire height of the plurality of sidewalls; and
a first electrical component disposed at least partially within the cavity and electrically coupled to one or more of the sidewalls along the entire height of the one or more of the sidewalls; and
a second electrical component disposed on the first major surface of the substrate.

11. The semiconductor package of claim 10, wherein the first electrical component is at least one of a capacitor, a resistor, and an inductor.

12. The semiconductor package of claim 10, wherein the second electrical component is a silicon die.

13. The semiconductor package of claim 12, wherein the silicon die is at least one of a central processing unit, a flash memory, a wireless charger, a power management integrated circuit (PMIC), a Wi-Fi transmitter, a global positioning system, and a NAND stack.

14. The semiconductor package of claim 10, wherein the conductive material comprises a first via at least partially embedded within the substrate.

15. The semiconductor package of claim 14, wherein the first via has a semicircular profile.

16. The semiconductor package of claim 15, wherein a first portion of the first via is flush with at least one sidewall.

* * * * *